(12) United States Patent
Fukui et al.

(10) Patent No.: US 10,177,289 B2
(45) Date of Patent: Jan. 8, 2019

(54) MOUNTING SUBSTRATE

(71) Applicant: Murata Manufacturing Co., Ltd., Nagaokakyo-shi, Kyoto-fu (JP)

(72) Inventors: Yuki Fukui, Nagaokakyo (JP); Junko Izumitani, Nagaokakyo (JP); Tadayuki Okawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/481,987

(22) Filed: Apr. 7, 2017

(65) Prior Publication Data
US 2017/0213943 A1 Jul. 27, 2017

Related U.S. Application Data
(63) Continuation of application No. PCT/JP2015/070640, filed on Jul. 21, 2015.

(30) Foreign Application Priority Data
Oct. 22, 2014 (JP) .................... 2014-215474

(51) Int. Cl.
*H01L 29/40* (2006.01)
*H01L 33/60* (2010.01)
(Continued)

(52) U.S. Cl.
CPC .......... *H01L 33/60* (2013.01); *H01L 23/5384* (2013.01); *H01L 23/5386* (2013.01);
(Continued)

(58) Field of Classification Search
CPC ... H01L 33/60; H01L 25/167; H01L 23/5389; H01L 23/5384; H01L 23/5386; H01L 33/62; H01L 29/866; H02H 9/045
(Continued)

(56) References Cited

U.S. PATENT DOCUMENTS 7,525,124 B2 * 4/2009 Takemori .............. H01L 33/486
257/678
7,994,628 B2 * 8/2011 Tseng .................... H01L 33/641
257/690
(Continued)

FOREIGN PATENT DOCUMENTS

JP 2006-86176 A 3/2006
JP 2010-34487 A 2/2010
(Continued)

OTHER PUBLICATIONS

International Search Report issued in International Application No. PCT/JP2015/070640, dated Sep. 8, 2015.
(Continued)

*Primary Examiner* — Vu A Vu
(74) *Attorney, Agent, or Firm* — Arent Fox LLP

(57) ABSTRACT

A mounting substrate that includes external connection electrodes on a rear surface of a base material, and mounting electrodes on a front surface of the base material. In-hole electrodes connect the external connection electrodes and the mounting electrodes. A reflective film containing Al is located between the base material and the mounting electrodes. The reflective film is covered with an insulating film layer.

12 Claims, 7 Drawing Sheets

(51) Int. Cl.
  *H01L 33/62*    (2010.01)
  *H01L 23/538*   (2006.01)
  *H01L 25/16*    (2006.01)
  *H02H 9/04*     (2006.01)
  *H01L 29/866*   (2006.01)

(52) U.S. Cl.
  CPC ........ *H01L 23/5389* (2013.01); *H01L 25/167* (2013.01); *H01L 33/62* (2013.01); *H02H 9/045* (2013.01); *H01L 29/866* (2013.01)

(58) Field of Classification Search
  USPC ....................................................... 257/774
  See application file for complete search history.

(56) References Cited

U.S. PATENT DOCUMENTS

| | | | |
|---|---|---|---|
| 8,217,416 B2 | 7/2012 | Kim et al. | |
| 8,680,546 B2 | 3/2014 | Konishi et al. | |
| 8,835,970 B2 | 9/2014 | Konishi et al. | |
| 9,178,125 B2 | 11/2015 | Konishi et al. | |
| 9,461,224 B2 | 10/2016 | Konishi et al. | |
| 2006/0054910 A1 | 3/2006 | Takemori et al. | |
| 2009/0029494 A1* | 1/2009 | Tseng | H01L 33/641 438/27 |
| 2009/0315057 A1* | 12/2009 | Konishi | H01L 24/97 257/98 |
| 2010/0295089 A1 | 11/2010 | Kim et al. | |
| 2012/0018759 A1 | 1/2012 | Ohta | |
| 2012/0181560 A1 | 7/2012 | Hiramatsu et al. | |
| 2012/0248481 A1 | 10/2012 | Seo | |
| 2013/0020598 A1* | 1/2013 | Yang | H01L 25/167 257/98 |
| 2014/0159092 A1 | 6/2014 | Konishi et al. | |
| 2014/0361331 A1 | 12/2014 | Konishi et al. | |
| 2015/0084080 A1* | 3/2015 | Kawakita | H01L 25/167 257/98 |
| 2016/0013387 A1 | 1/2016 | Konishi et al. | |
| 2016/0359095 A1 | 12/2016 | Konishi et al. | |

FOREIGN PATENT DOCUMENTS

| | | |
|---|---|---|
| JP | 2011-502356 A | 1/2011 |
| JP | 2012-49512 A | 3/2012 |
| JP | 2012-151191 A | 8/2012 |
| JP | 2013-89717 A | 5/2013 |
| JP | 2013-115088 A | 6/2013 |
| JP | 2014-17303 A | 1/2014 |

OTHER PUBLICATIONS

Written Opinion of the International Searching Authority issued in International Application No. PCT/JP2015/070640, dated Sep. 8, 2015.

* cited by examiner

MOUNTING SUBSTRATE

CROSS REFERENCE TO RELATED APPLICATIONS

The present application is a continuation of International application No. PCT/JP2015/070640, filed Jul. 21, 2015, which claims priority to Japanese Patent Application No. 2014-215474, filed Oct. 22, 2014, the entire contents of each of which are incorporated herein by reference.

FIELD OF THE INVENTION

The present invention relates to a mounting substrate for mounting, on the surface thereof, a light-emitting element.

BACKGROUND OF THE INVENTION

Patent Document 1 discloses a LED submount for mounting a semiconductor light emitting diode (LED element) onto a mother substrate. The LED submount described in Patent Document 1 forms a base substrate of Si for the LED submount, and a reflective film (Al thin film) between the substrate and an LED element mounted on the substrate. Thus, light output from the LED element toward the base substrate of Si is reflected by the reflective film. As a result, the luminescent efficiency of the LED element is increased.

Patent Document 1: Japanese Patent Application Laid-Open No. 2006-86176

SUMMARY OF THE INVENTION

According to Patent Document 1, the reflective film is provided to be exposed. For this reason, there is a possibility that the reflective film will be altered under the influence of water and the like, depending on storage conditions or use environments for the LED submount. The alteration of the reflective film has the possibility of leading to a decrease in reflectivity and thus causing quality deterioration, thereby resulting in a decrease in luminescent efficiency.

Therefore, an object of the present invention is to provide a mounting substrate which prevents a reflective film from being altered, thereby suppressing a decrease in luminescent efficiency.

A mounting substrate according to the present invention includes a base material having a first principal surface, a second principal surface opposing the first principal surface, and a through hole extending from the first principal surface to the second principal surface; a reflective film extending over the second principal surface; an insulating film layer covering the reflective film; an external connection electrode extending over the first principal surface of the base material; a mounting electrode extending over the insulating film layer; and a connecting conductor in the through hole and electrically connecting the external connection electrode and the mounting electrode.

In accordance with this configuration, the reflective film covered with the insulating film layer can protect the reflective film from the ambient environment. As a result, the reflective film can be prevented from being altered. Furthermore, the conductive thin film can be formed to be uniform in film thickness, and a light-emitting element in mounting is thus made uniform in height, thereby making it possible to maintain the light-emitting element mounted on the mounting electrodes. In addition, the use of the conductive thin film can be expected to improve radiation performance.

Preferably, the conductor for external connection includes a first external connection conductor and a second external connection conductor, formed at a predetermined distance from each other, the mounting electrode includes a first component mounting conductor and a second component mounting conductor formed at a predetermined distance from each other, the connecting conductor includes a first connecting conductor that connects the first external connection conductor and the first component mounting conductor, and a second connecting conductor that connects the second external connection conductor and the second component mounting conductor.

The reflective film is sandwiched between the first component mounting conductor and the second component mounting conductor, in a planar view, the reflective film defining a first opening and a second opening in regions respectively corresponding to the first connecting conductor and the second connecting conductor.

The first opening and the second opening can be smaller than the first component mounting conductor and the second component mounting conductor in the planar view.

In accordance with this configuration, the reflective film is formed to extend at least under the peripheries of the first component mounting conductor and second component mounting conductor (on the base material side). More specifically, in the planar view, the second principal surface of the base material is configured not to be exposed around the first component mounting conductor and the second component mounting conductor. For this reason, light emitted from a light-emitting element toward the base material is reflected by the reflective film without transmission toward the base material. As a result, light from the light-emitting element can be reflected efficiently, and the luminescent efficiency of the light-emitting element can be thus increased.

The first opening and the second opening can also be larger than the first component mounting conductor and the second component mounting conductor in the planar view.

In accordance with this configuration, in the planar view, the reflective film has no overlap with the first component mounding conductor and the second component mounting conductor, thus making it possible to prevent short circuit defects which can be possibly caused between the films and the conductors.

The reflective film is preferably a thin film containing Al, Ag, and Rh.

In accordance with this configuration, the thin film with a high reflectivity can further increase the luminescent efficiency of a light-emitting element. In addition, alterations due to environmental factors such as humidity are less likely to be caused, and stable reflection characteristics are thus achieved over a long period of time.

The reflective film is preferably formed inside a periphery of the second principal surface of the base material.

In accordance with this configuration, alterations due to stress, which are likely to be caused in the case of coating directly with a resin film, can be inhibited by coating the reflective film with the insulating film layer without forming the reflective film entirely over the second principal surface of the base material.

The first principal surface of the base material preferably includes an electrostatic protection element between the first external connection conductor and the second external connection conductor.

In accordance with this configuration, a light-emitting element mounted on the mounting substrate can be protected from damage by ESD discharge. In addition, the reflective film formed over the second principal surface of the base material keeps light emitted from the light-emitting element from leaking towards the base material, thus making it possible to protect the electrostatic protection element.

Preferably, the base material includes a plurality of through holes, and a plurality of connecting conductors respectively in the plurality of through holes. In accordance with this configuration, the conductivity can be increased between the mounting electrodes and the electrodes for external connections.

According to the present invention, light emitted from a light-emitting element toward the base material is reflected by the reflective film without transmission toward the base material. As a result, light from the light-emitting element can be reflected efficiently, and the luminescent efficiency of the light-emitting element can be thus increased. Further, the reflective film covered with the insulating film layer can protect the reflective film from the ambient environment, and the reflective film can be prevented from being altered, thereby suppressing a decrease in luminescent efficiency.

DETAILED DESCRIPTION OF THE INVENTION

Embodiment 1

Figure 1:
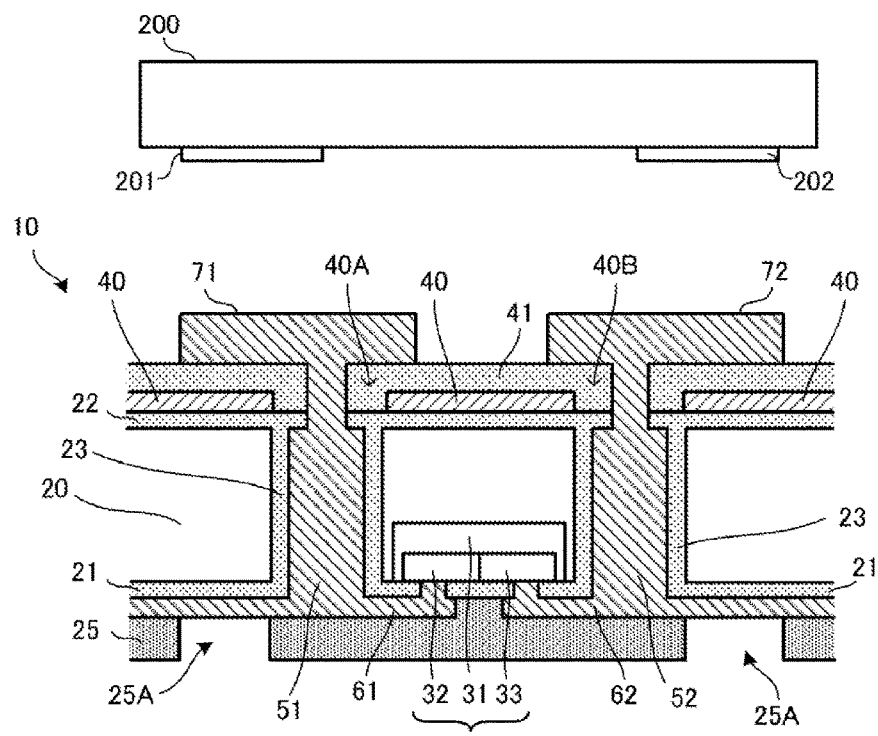
FIG. 1 is a cross-sectional view of a mounting substrate according to Embodiment 1.
Figure 2:
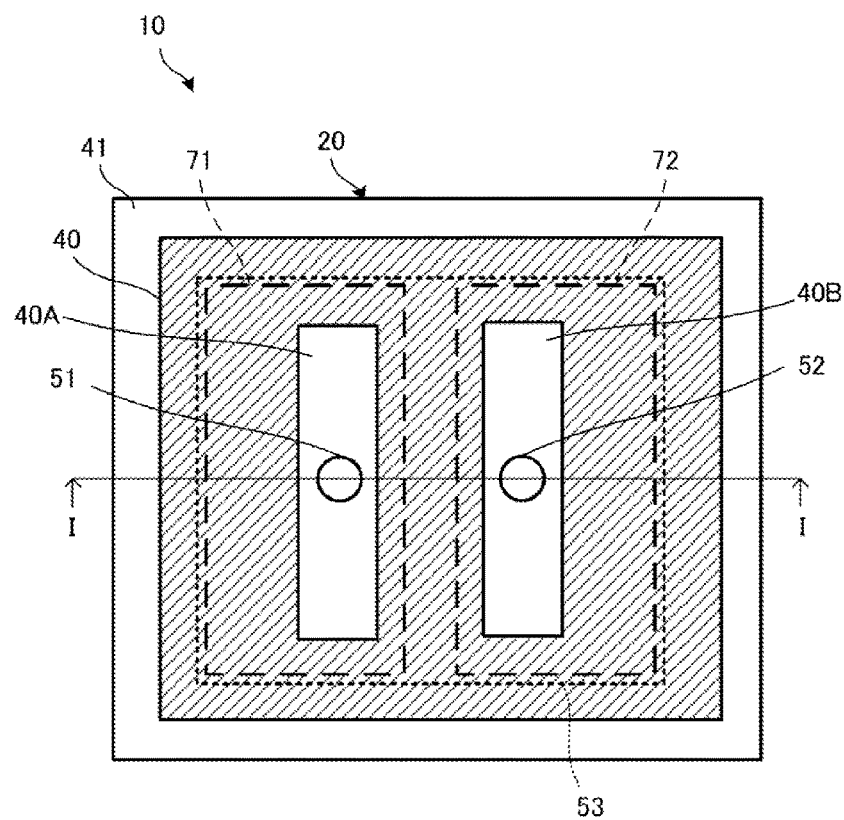
FIG. 2 is a plan view of a mounting substrate.

FIG. 1 is a cross-sectional view of a mounting substrate 10 according to the present embodiment. FIG. 2 is a plan view of the mounting substrate 10. FIG. 1 is a cross-sectional view of FIG. 2 along the line I-I. In addition, FIG. 2 is a view seen through some parts (after-mentioned mounting electrodes 71, 72).

The mounting substrate 10 is a substrate for mounting a semiconductor light-emitting element 200 thereon. The semiconductor light-emitting element 200 emits light at the surface thereof, and includes connecting electrodes 201, 202 on the rear surface. The connecting electrodes 201, 202 are soldered to the mounting substrate 10, thereby mounting the semiconductor light-emitting element 200 onto the mounting substrate 10.

The mounting substrate 10 includes a base material 20. The base material 20 has a cuboid shape including the surface (second principal surface) and rear surface (first principal surface) perpendicular to the thickness direction, and is an insulating semiconductor such as silicon single crystals. It is to be noted that the base material 20 is not always required to have an insulating property, but may be a base material of a semiconductor. The surface of the base material 20 is a surface for mounting the semiconductor light-emitting element 200. In addition, the rear surface of the base material 20 refers to a surface to be mounted onto a mother substrate, not shown.

The rear surface of the base material 20 has a well layer 31 formed therein. The well layer 31 partially has an n-type doped layer 32 and a p-type doped layer 33 formed. The layered structure of the n-type doped layer 32 and the p-type doped layer 33 forms a zener diode 30. This zener diode 30 functions as an electrostatic protection element, thereby protecting the semiconductor light-emitting element 200, which is mounted on the mounting substrate 10, from damage by ESD discharge.

Highly insulating films 21, 22 are formed over the entire surface and rear surface of the base material 20. The highly insulating films 21, 22 are, for example, SiOx films.

Electrodes 61, 62 for external connection are on the surface of the highly insulating film 21. The electrodes 61, 62 for external connection are formed at a predetermined distance on the rear surface of the base material 20. The highly insulating film 21 is removed near ends of the electrodes 61, 62 for external connection. At the parts with the highly insulating film 21 removed, the electrode 61 for external connection is connected to the n-type doped layer 32, whereas the electrode 62 for external connection is connected to the p-type doped layer 33. Thus, provided is a structure with the zener diode 30 connected between the electrodes 61, 62 for external connection.

At the surface of the highly insulating film 21, a highly insulating film 25 such as a polyimide is formed so as to cover the electrodes 61, 62 for external connection. The highly insulating film 25 has openings 25A formed so as to partially expose the electrodes 61, 62 for external connection. The surface of the highly insulating film 25 is provided with extended electrodes, not shown, connected to the electrodes 61, 62 for external connection through the openings 25A, and the extended electrodes are soldered to electrodes of a mother substrate (not shown), thereby mounting the mounting substrate 10 on the mother substrate. The electrodes 61, 62 for external connection correspond to the "first external connection conductor" and "second external connection conductor" according to the present invention.

On the surface of the highly insulating film 22, a reflective film 40 is formed. An insulating film layer 41 is formed so as to coat the reflective film 40. The reflective film 40 and the insulating film layer 41 will be described in detail later.

On the surface of the insulating film layer 41, the mounting electrodes 71, 72 are formed at a predetermined distance. The mounting electrode 71 is opposed to the electrode 61 for external connection, with the base material 20 interposed therebetween. The mounting electrode 72 is opposed to the electrode 62 for external connection, with the base material 20 interposed therebetween. Onto the mounting electrodes 71, 72, the connecting electrodes 201, 202 of the semiconductor light-emitting element 200 are mounted with soldering. The mounting electrodes 71, 72 correspond to the "first component mounting conductor" and "second component mounting conductor" according to the present invention.

Holes (not shown) through the base material 20 in the thickness direction thereof are formed respectively in a region with an overlap between the electrode 61 for external connection and the mounting electrode 71 and a region with an overlap between the electrode 62 for external connection and the mounting electrode 72. A highly insulating film 23 such as SiOx is formed on the inner wall surfaces of the respective holes. Further, in-hole electrodes 51, 52 are formed in the holes. The in-hole electrode 51 connects the electrode 61 for external connection and the mounting electrode 71. The in-hole electrode 52 connects the electrode 62 for external connection and the mounting electrode 72. The in-hole electrodes 51, 52 correspond to the "first connecting conductor" and "second connecting conductor" according to the present invention.

The reflective film 40 formed on the surface of the highly insulating film 22 is a thin film containing Al, for example, AlSiCu, AlCu, or the like. Light emitted from the semiconductor light-emitting element 200, which is mounted onto the mounting substrate 10, toward the base material 20 is reflected by the reflective film 40. The reflective film 40 is, in a planar view, smaller than the entire surface of the base material 20, and formed such that the base material 20 is not exposed around the mounting electrodes 71, 72.

Specifically, the reflective film 40 is formed to be sandwiched between the base material 20 and the mounting electrodes 71, 72, and is provided with openings 40A, 40B with the in-hole electrodes 51, 52 disposed therein. The sizes and shapes of the openings 40A, 40B are not particularly limited, but at least smaller than the mounting electrodes 71, 72 in the planar view. For this reason, the reflective film 40 is configured to have overlaps with peripheral parts of the mounting electrodes 71, 72. Thus, the base material 20 is not exposed around the mounting electrodes 71, 72 in the planar view. As just described, because of the formation of the reflective film 40, light emitted from the semiconductor light-emitting element 200 toward the base material 20 is reflected by the reflective film 40 without transmission to the base material 20.

The openings 40A, 40B correspond to the "first opening" and "second opening" according to the present invention.

It is to be noted that the reflective film 40 is formed to have overlaps with the mounting electrodes 71, 72 in the planar view, but may have no overlaps with the mounting electrodes 71, 72. In this regard, a region where the semiconductor light-emitting element 200 is mounted onto the mounting substrate 10 is referred to as a mounting region 53 in FIG. 2. The reflective film 40 has only to be formed to coat at least a region opposed to the mounting region 53 around the mounting electrodes 71, 72 in the planar view. Thus, the base material 20 is not exposed around the mounting electrodes 71, 72 in the planar view. As a result, light emitted from the semiconductor light-emitting element 200 toward the base material 20 is reflected by the reflective film 40 without transmission toward the base material 20.

The insulating film layer 41 is formed over the entire surface of the base material 20, so as to cover the reflective film 40. The insulating film layer 41 is, for example, a SiOx film, as with the highly insulating films 21, 22. As described previously, the reflective film 40 is not formed over a peripheral part of the surface of the base material 20. For this reason, the formation of the insulating film layer 41 over the entire surface of the base material 20 makes the reflective film 40 entirely coated with the insulating film layer 41. Thus, the reflective film can be prevented from being altered by the influence of an environment in use, in particular, humidity, and stress from a resin for use in mounting the semiconductor light-emitting element can be relieved.

The reflective film 40 is a thin film containing Al, that is, a conductive thin film, and can be thus formed to be uniform in film thickness. For this reason, the mounting electrodes 71, 72 formed on the surface of the insulating film layer 41 coating the reflective film 40 are smooth, thereby achieving the uniformity in the height of the semiconductor light-emitting element 200 mounted, and making it possible to maintain the semiconductor light-emitting element 200 mounted. In addition, because the mounting electrodes 71, 72 are smooth, the areas of close contact between the mounting electrodes 71, 72 and the connecting electrodes 201, 202 are increased, thereby improving the radiation performance. Furthermore, in the present embodiment, the mounting electrodes 71, 72 are not electrically connected through the reflective film 40 because the insulating film layer 41 is formed therebetween.

In particular, in the present embodiment, the reflective film 40 as a thin film containing Al is coated with the insulating film layer 41. For this reason, light can be reflected stably while inhibiting alterations due to environmental factors such as stress and humidity. In addition, Al varies little in reflectivity depending on wavelength, and can thus stably reflect light. It is to be noted that the reflective film 40 may be a thin film containing one of Ag and Rh that has a high reflectivity, other than Al.

In addition, light emitted from the semiconductor light-emitting element 200 mounted on the mounting substrate 10 is emitted not only forward (to the surface), but also toward the mounting substrate 10. The light emitted toward the base material 20 is reflected by the reflective film 40. In this case, the light emitted toward the base material 20 is not transmitted toward the base material 20 because the surface of the base material 20 is not exposed in the planar view. If the reflective film 40 has a slit or the like formed, thereby exposing the surface of the base material 20, light is transmitted to the base material 20, thereby resulting in a decrease in the luminescent efficiency of the semiconductor light-emitting element 200. According to the present embodiment, the light transmission to the base material 20 can be suppressed, and light from the semiconductor light-emitting element 200 can be thus efficiently reflected, thereby increasing the luminescent efficiency of the semiconductor light-emitting element 200.

Figure 3:
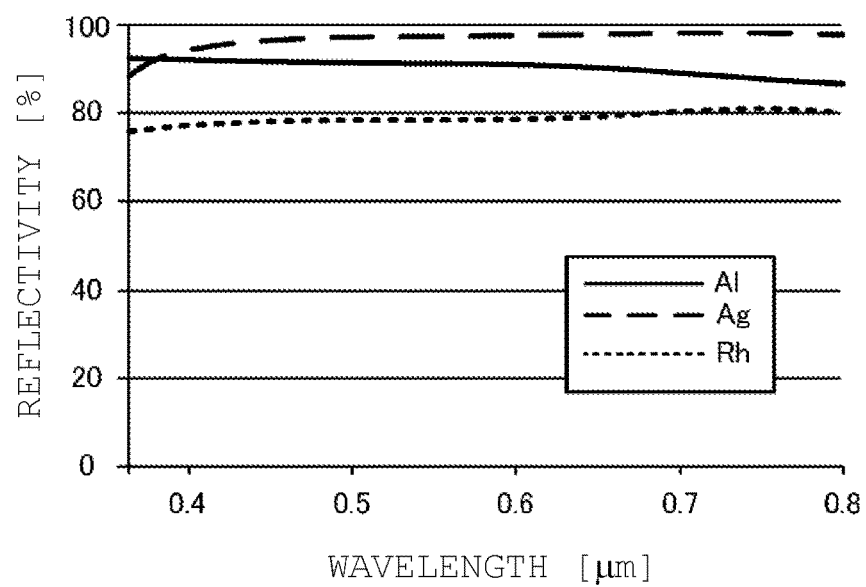
FIG. 3 is a graph showing the reflectivity in the case of reflective films containing Al, Ag, and Rh.

FIG. 3 is a graph showing the reflectivity in the case of reflective films containing Al, Ag, and Rh. The horizontal axis of the graph shown in FIG. 3 indicates a light wavelength [µm], whereas the vertical axis thereof indicates a reflectivity [%] at the reflective film. In the case of Al, a reflectivity of approximately 90% can be achieved regardless of the light wavelength. In the case of Ag, a reflectivity of approximately 95% can be achieved, and in the case of Rh, a reflectivity of approximately 77% can be achieved. As just described, the use of one of Al, Ag, and Rh for the reflective film 40 achieves a high reflectivity, which is substantially constant regardless of the light wavelength, thus making it possible to increase the luminescent efficiency of the semiconductor light-emitting element 200.

It is to be noted that while the conductive film is provided as the reflective film 40 herein, the reflective film is not limited to any conductive film, but may be composed of an insulator such as a resin as long as the insulator has the function of reflecting light.

A method for manufacturing the mounting substrate 10 will be described below.

Figure 4:
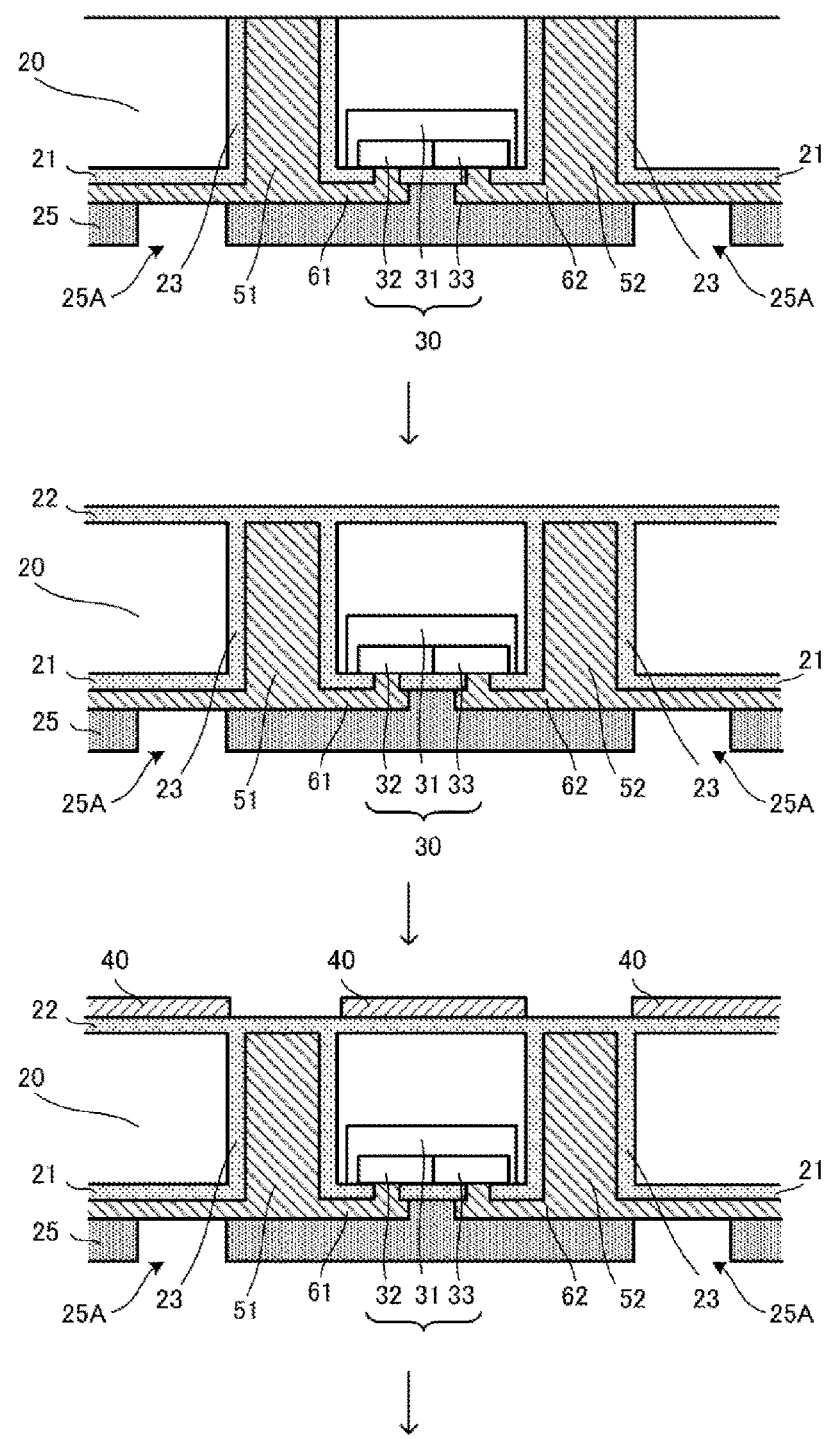
FIG. 4 is a diagram illustrating in order a process for manufacturing a mounting substrate.
Figure 5:
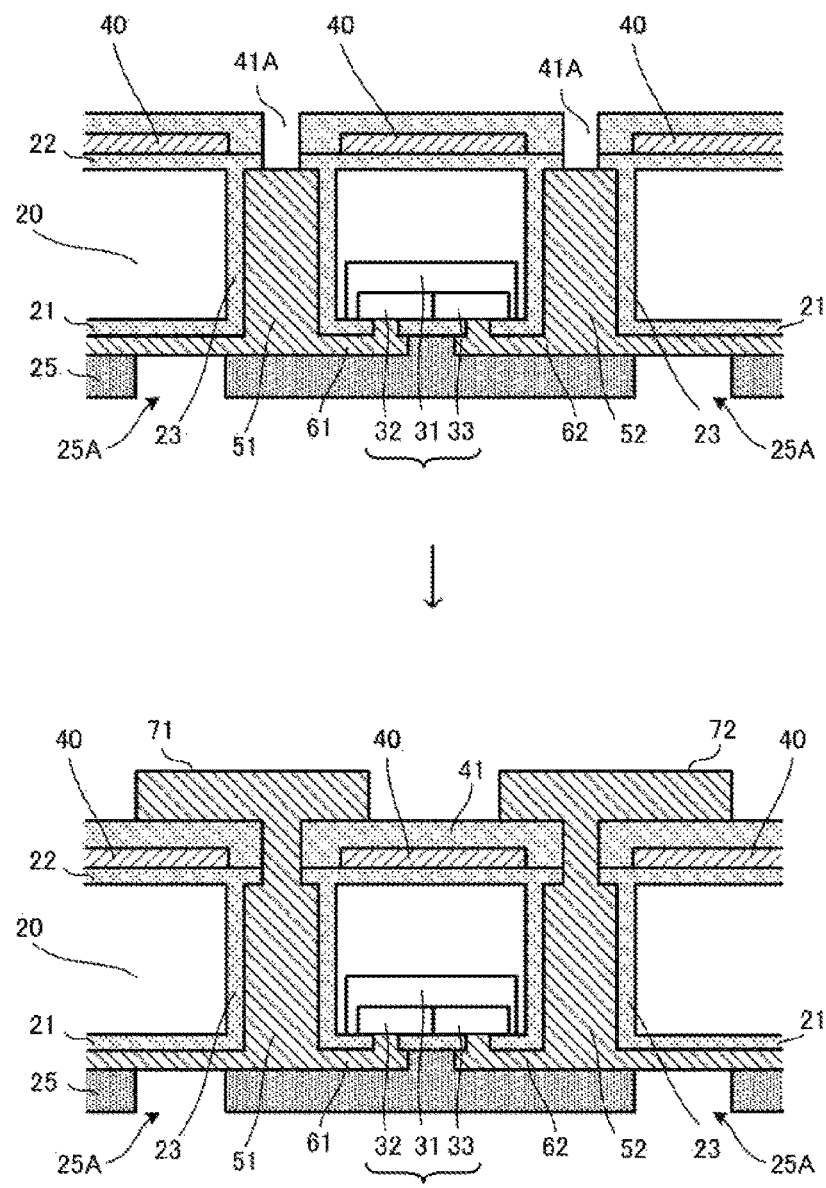
FIG. 5 is a diagram illustrating in order the process for manufacturing the mounting substrate.

FIGS. 4 and 5 are diagrams illustrating in order a process for manufacturing the mounting substrate 10. In FIGS. 4 and 5, the mounting substrate 10 is shown in cross-sectional views.

The zener diode 30 composed of the n-type doped layer 32 and the p-type doped layer 33 as described above is formed on the rear surface of the base material 20. The n-type doped layer 32 and the p-type doped layer 33 are formed with the use of, for example, an ion implantation method or the like. Holes (not shown) are formed for the base material 20. The highly insulating films 21, 23 are formed by a thermal oxidation method or the like on the rear surface of the base material 20 and the inner wall surfaces of the holes. The in-hole electrodes 51, 52 are formed in the holes, and the electrodes 61, 62 for external connection, electrically connected to the in-hole electrodes 51, 52, are formed on the rear surface of the base material 20.

Specifically, a plating seed layer is formed by a sputtering method on the rear surface of the base material 20. The plating seed layer is formed by sputtering, for example, titanium (Ti) and copper (Cu) in this order. Then, the plating seed layer is subjected to patterning by a photolithography method, and on the surface of the patterned plating seed layer, copper (Cu), nickel (Ni), and gold (Au) are sequentially provided to undergo growth by plating, thereby forming the electrodes 61, 62 for external connection.

The highly insulating layer 25 for coating the electrodes 61, 62 for external connection is formed over the rear surface of the base material 20. The openings 25A for partially exposing the electrodes 61, 62 for external connection are formed in the insulating layer 25.

Next, on the surface of the base material 20, the highly insulating film 22 is formed by a thermal oxidation method or the like. Then, the reflective film 40 is formed on the surface of the highly insulating film 22. The method for the formation is, for example, liftoff, dry etching, or the like. In the formation of the reflective film 40, a Ti-containing layer of 20 nm or less is preferably formed under the Al thin film. This formation improves the adhesion. In addition, the film formation as a Ti layer can make the Al thin film uniform, and as a result, increase the reflectivity at the reflective film 40.

Next, the insulting film layer 41 is formed so as to cover the reflective film 40, and openings 41A are formed in the highly insulating film 22 and the insulating film layer 41. Then, a plating seed layer composed of titanium (Ti) and copper (Cu) is formed on the insulating film layer 41, and then subjected to patterning, and copper (Cu), nickel (Ni), and gold (Au) are further sequentially provided to undergo growth by plating, thereby forming the mounting electrodes 71, 72. The mounting electrodes 71, 72 are connected to the in-hole electrodes 51, 52 through the openings 41A formed in the highly insulating film 22 and the insulating film layer 41. In accordance with this process, the mounting substrate 10 is formed.

It is to be noted that while the in-hole electrodes 51, 52 are formed respectively as single electrodes in the mounting substrate 10 according to the present embodiment, in-hole electrodes 51, 52 may be formed as multiple electrodes in order to increase the conductivity between the electrodes 61, 62 for external connection and the mounting electrodes 71, 72.

Figure 6:
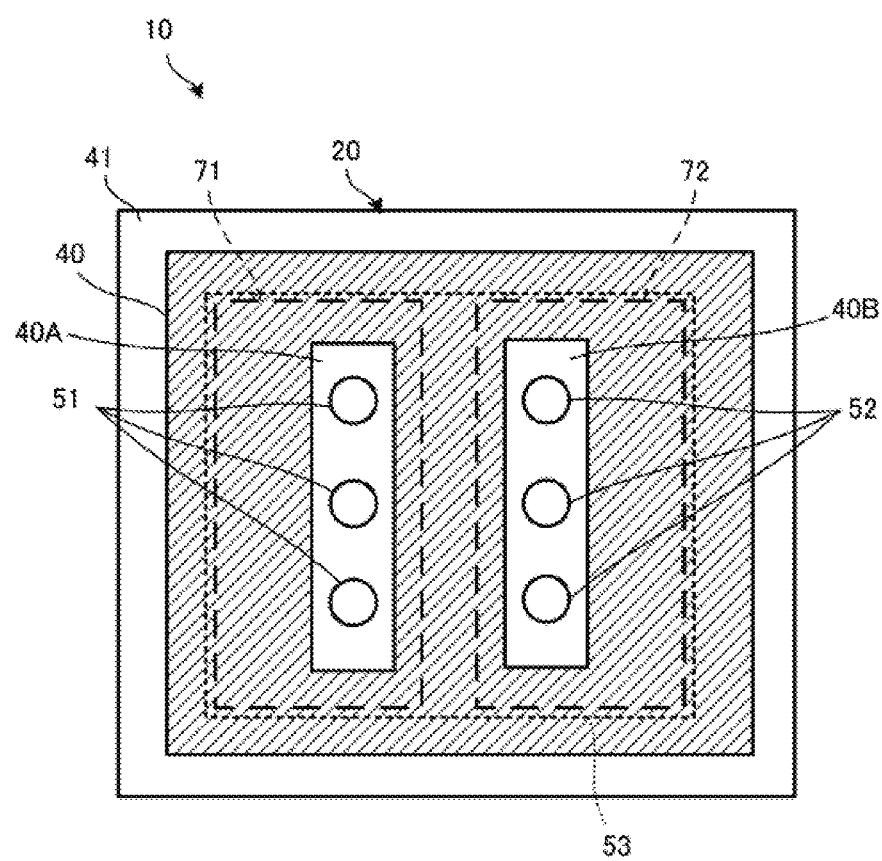
FIG. 6 is a plan view of a mounting substrate with multiple in-hole electrodes formed.

FIG. 6 is a plan view of a mounting substrate 10 with multiple in-hole electrodes 51, 52 formed. In this example, three in-hole electrodes 51 and three in-hole electrodes 52 are formed respectively in openings 40A and 40B formed in a reflective film 40. The three in-hole electrodes 51 connect a mounting electrode 71 and an electrode 61 for external connection (not shown in FIG. 6), whereas the three in-hole electrodes 52 connect a mounting electrode 72 and an electrode 62 for external connection (not shown in FIG. 6). Even when the in-hole electrodes 51, 52 are formed respectively as multiple electrodes, the reflective film 40 is formed such that a base material 20 is not exposed around the mounting electrodes 71, 72 in a planar view. Thus, light emitted from a semiconductor light-emitting element 200 toward the base material 20 is reflected by the reflective film 40 without transmission toward the base material 20, thereby making it possible to increase the luminescent efficiency of the semiconductor light-emitting element 200.

Embodiment 2

Figure 7:
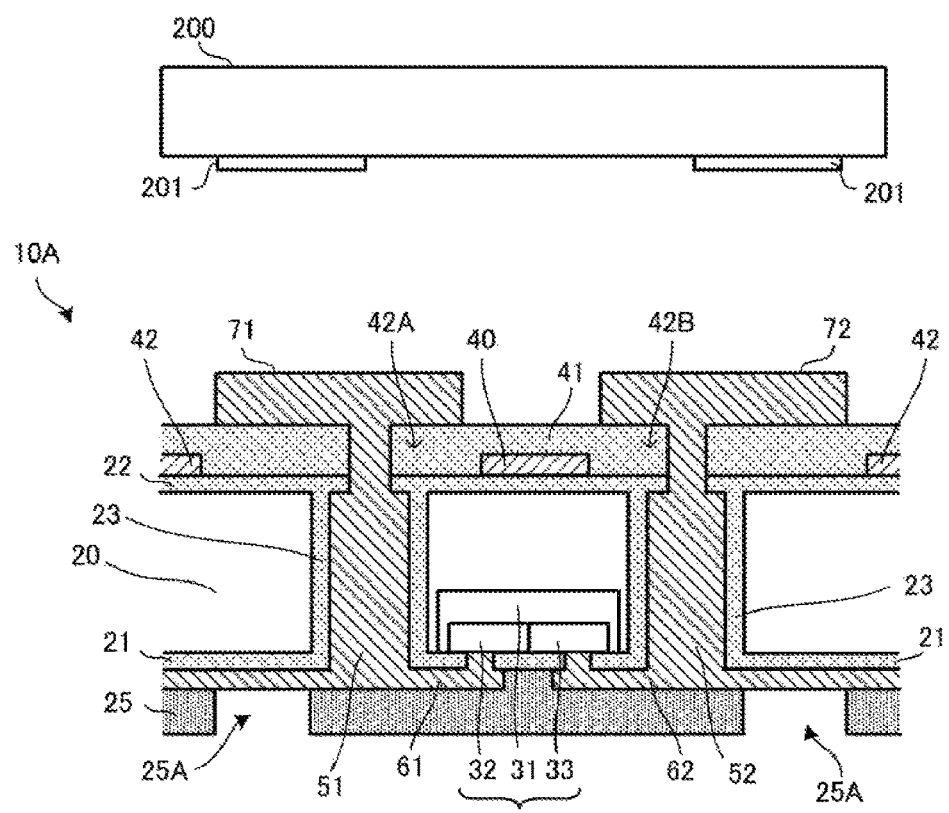
FIG. 7 is a cross-sectional view of a mounting substrate according to Embodiment 2.
Figure 8:
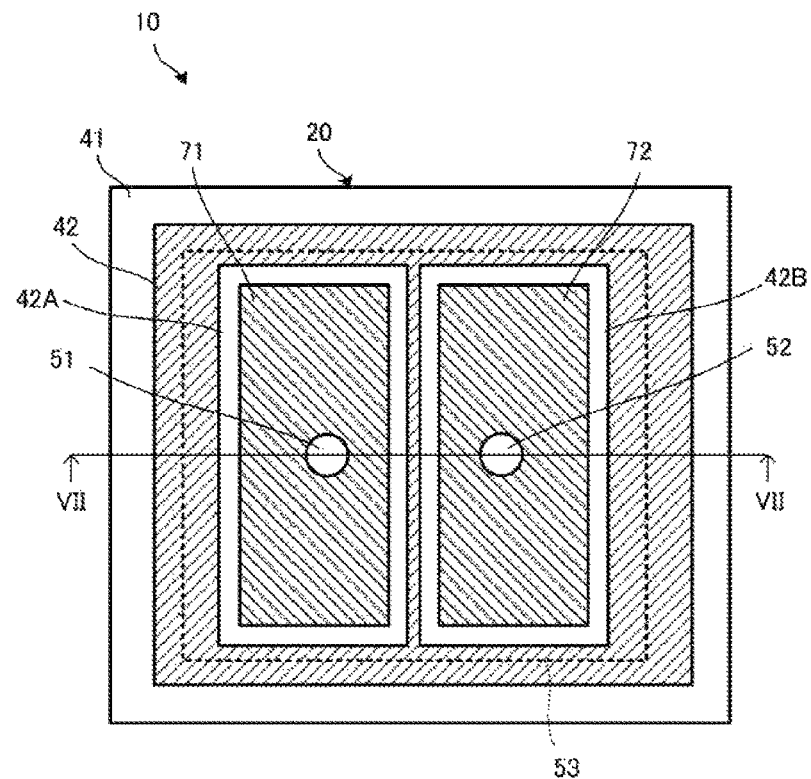
FIG. 8 is a plan view of a mounting substrate.

FIG. 7 is a cross-sectional view of a mounting substrate 10A according to the present embodiment. FIG. 8 is a plan view of the mounting substrate 10A. FIG. 7 is a cross-sectional view of FIG. 8 along the line VII-VII. The present embodiment differs from Embodiment 1 in size for openings 42A, 42B formed in a reflective film 42. Hereinafter, only the reflective film 42 will be described. The others have the same configurations as in Embodiment 1, and the explanations will be left out.

The reflective film 42 is a thin film containing Al, and formed on the surface of a highly insulating film 22. An insulating film layer 41 is formed so as to coat the reflective film 42. The reflective film 42 is formed so as to be sandwiched between a base material 20 and mounting electrodes 71, 72, and has the openings 42A, 42B with in-hole electrodes 51, 52 disposed therein. The shapes of the openings 42A, 42B are not particularly limited, but larger in size than the mounting electrodes 71, 72 in a planar view. In addition, the openings 42A, 42B have sizes not to extend beyond a mounting region 53.

When the openings 42A, 42B are made larger in size in the planar view than the mounting electrodes 71, 72, there is no overlap between the reflective film 42 and the mounting electrodes 71, 72, and short circuit defects which can be possibly generated therebetween can be thus prevented, thereby ensuring insulating performance. When the reflective film 42 as a thin film containing Al is coated with an insulating film layer 41, light can be reflected stably while inhibiting alterations due to environmental factors such as stress and humidity.

Figure 9:
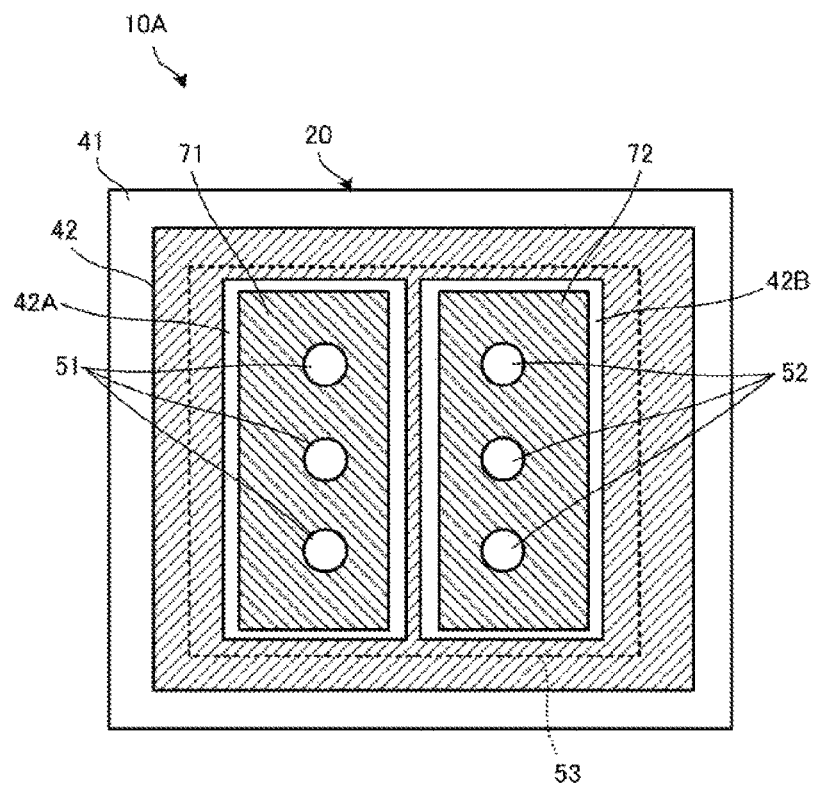
FIG. 9 is a plan view of a mounting substrate with multiple in-hole electrodes formed.

FIG. 9 is a plan view of a mounting substrate 10A with multiple in-hole electrodes 51, 52 formed. In this example, three in-hole electrodes 51 and three in-hole electrodes 52 are formed respectively in openings 42A and 42B formed in a reflective film 42. The three in-hole electrodes 51 connect a mounting electrode 71 and an electrode 61 for external connection (not shown in FIG. 9), whereas the three in-hole electrodes 52 connect a mounting electrode 72 and an electrode 62 for external connection (not shown in FIG. 9). Even when the multiple in-hole electrodes 51, 52 are formed, the openings 42A and 42B of the reflective film 42 are larger than the mounting electrodes 71, 72 in a planar view. For this reason, there is no overlap between the reflective film 42 and the mounting electrodes 71, 72, and short circuit defects which can be possibly generated therebetween can be thus prevented. Further, when the reflective film 42 as a thin film containing Al is coated with an insulating film layer 41, light can be reflected stably while inhibiting alterations due to environmental factors such as stress and humidity.

DESCRIPTION OF REFERENCE SYMBOLS 10, 10A: mounting substrate
20: base material
21, 22, 23, 25: highly insulating film
30: zener diode
31: well layer
32: n-type doped layer
33: p-type doped layer
40, 42: reflective film 40A, 40B: opening
42A, 42B: opening
41: insulating film layer
41A: opening
51, 52: in-hole electrode
53: mounting region
61, 62: electrode for external connection
71, 72: mounting electrode
200: semiconductor light-emitting element
201, 202: connecting electrode

The invention claimed is:

1. A mounting substrate comprising:
a base material having a first principal surface, a second principal surface opposing the first principal surface, and a through hole extending from the first principal surface to the second principal surface;
an insulating film layer on the second principal surface;
a reflective film on the insulating film layer, the reflective film having a smaller area than that of the insulating film layer;
a first external connection conductor extending over the first principal surface of the base material;
a second external connection conductor located a first predetermined distance from the first external connection conductor;
a first component mounting conductor extending over the insulating film layer;
a second component mounting conductor at a second predetermined distance from the first component mounting conductor;
a first connecting conductor in the through hole and electrically connecting the first external connection conductor and the first component mounting conductor;
a second connecting conductor that connects the second external connection conductor and the second component mounting conductor; and
an electrostatic protection element between the first external connection conductor and the second external connection conductor.

2. The mounting substrate according to claim 1, wherein the reflective film is sandwiched between the first component mounting conductor and the second component mounting conductor, in a planar view, the reflective film defining a first opening and a second opening in regions respectively corresponding to the first connecting conductor and the second connecting conductor.

3. The mounting substrate according to claim 2, wherein the first opening and the second opening are respectively smaller than the first component mounting conductor and the second component mounting conductor in the planar view.

4. The mounting substrate according to claim 2, wherein the first opening and the second opening are respectively larger than the first component mounting conductor and the second component mounting conductor in the planar view.

5. The mounting substrate according to claim 2, wherein the reflective film comprises at least one of Al, Ag, and Rh.

6. The mounting substrate according to claim 2, wherein the reflective film is inside a periphery of the insulating film layer.

7. A mounting substrate comprising:
a base material having a first principal surface, a second principal surface opposing the first principal surface, and a through hole extending from the first principal surface to the second principal surface;
an insulating film layer on the second principal surface;
a reflective film on the insulating film layer, the reflective film having a smaller area than that of the insulating film layer;
an external connection electrode extending over the first principal surface of the base material;
a mounting electrode extending over the insulating film layer;
a connecting conductor in the through hole and electrically connecting the external connection electrode and the mounting electrode; and
an electrostatic protection element electrically connected to the external connection electrode.

8. The mounting substrate according to claim 7, wherein the reflective film comprises at least one of Al, Ag, and Rh.

9. The mounting substrate according to claim 7, wherein the reflective film is inside a periphery of the insulating film layer.

10. The mounting substrate according to claim 7, wherein the base material includes a plurality of through holes, and
a plurality of connecting conductors respectively in the plurality of through holes.

11. The mounting substrate according to claim 7, further comprising:
a first insulating material covering the reflective film; and
a second insulating material between the external connection electrode and the first principal surface of the base material.

12. The mounting substrate according to claim 11, further comprising a third insulating material between the connecting conductor and the base material.

* * * * *